United States Patent
Kaneda et al.

(10) Patent No.: US 6,278,219 B1
(45) Date of Patent: *Aug. 21, 2001

(54) SURFACE ACOUSTIC WAVE REFLECTING DEVICE HAVING REFLECTANCE SIMILAR TO THE HAMMING FUNCTION

(75) Inventors: Yasufumi Kaneda, Suzaka; Jun Tsutsumi, Kawasaki; Kenya Hashimoto, Funabashi; Tatsuya Omori; Motoyuki Tajima, both of Chiba; Masatsune Yamaguchi, Sakura, all of (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/407,985

(22) Filed: Sep. 29, 1999

(30) Foreign Application Priority Data

Nov. 20, 1998 (JP) .................................................. 10-331579

(51) Int. Cl.$^7$ ..................................................... H03H 9/64
(52) U.S. Cl. ................................. 310/313 D; 310/313 B
(58) Field of Search .................... 333/193; 310/313 R, 310/313 A, 313 B, 313 D, 340, 348

(56) References Cited

U.S. PATENT DOCUMENTS

| 4,204,178 | * | 5/1980 | Mitchell | 333/194 |
|---|---|---|---|---|
| 4,281,301 | | 7/1981 | Stevens et al. | 333/195 |
| 4,484,160 | * | 11/1984 | Riha | 333/195 |
| 4,635,009 | * | 1/1987 | Ebata | 333/195 |
| 4,701,657 | * | 10/1987 | Grassl | 310/313 C |
| 5,084,687 | * | 1/1992 | Vale et al. | 333/153 |
| 5,270,606 | | 12/1993 | Cho et al. | 310/313 D |
| 5,434,466 | * | 7/1995 | Hickernell et al. | 310/313 D |
| 5,463,361 | * | 10/1995 | Allen | 333/193 |
| 5,661,444 | | 8/1997 | Dill et al. | 333/195 |
| 5,682,126 | * | 10/1997 | Plesski et al. | 333/193 |
| 5,838,091 | * | 11/1998 | Watanabe | 310/313 C |

FOREIGN PATENT DOCUMENTS

| 196 38 395 A1 | 4/1998 | (DE) | H03H/9/145 |
|---|---|---|---|
| 0 559 343 A1 | 9/1983 | (EP) | H03H/9/02 |
| 0 579 871 A1 | 1/1994 | (EP) | G06G/7/195 |
| 0 671 813 A1 | 9/1995 | (EP) | H03H/9/02 |
| 2-186708 * | 7/1990 | (JP) | 310/313 D |
| 7-336187 | 12/1995 | (JP) | H03H/9/25 |

* cited by examiner

Primary Examiner—Thomas M. Dougherty
(74) Attorney, Agent, or Firm—Arent Fox KinterPlotkin & Kahn, PLLC

(57) ABSTRACT

A surface acoustic wave device which reflects a surface acoustic wave is provided. The reflector of the surface acoustic wave device includes electrode fingers. The electrode fingers are disposed at predetermined intervals d, and are divided into five groups by the width. The widths w of the electrode fingers are varied between widths w1, w2, and w3, so that the reflectance becomes similar to the Hamming function.

7 Claims, 15 Drawing Sheets

SURFACE ACOUSTIC WAVE REFLECTING DEVICE HAVING REFLECTANCE SIMILAR TO THE HAMMING FUNCTION

BACKGROUND OF THE INVENTION

1. Field of the Invention

The present invention generally relates to surface acoustic wave devices, and more particularly, to a surface acoustic wave device which reflects a surface acoustic wave.

2. Description of the Related Art

In recent years, portable telephones, cordless telephones, and radio communication devices have been rapidly becoming smaller and lighter, and hence widely spread. Those wireless devices include high-frequency circuits.

Such high-frequency circuits include filters. To obtain a small and light high-frequency circuit, a surface acoustic wave device (hereinafter also called SAW device) is used as a filter. The substrate of the SAW device transmits and receives a surface acoustic wave via reflectors, so that desired filter characteristics can be obtained.

The reflectors of the conventional SAW device consist of the grating of electrode fingers disposed on a piezoelectric substrate. The frequency response of the reflector is determined by the reflectivity of each electrode finger. The reflectivity of each electrode finger is determined by its width.

U.S. Pat. No. 5,270,606 discloses a reflector in which the reflectivity of each electrode finger is continuously changed so as to obtain a frequency response having a desired bandwidth. To continuously change the reflectivity, the widths of the electrode fingers are gradually varied.

However, the reflector has hundreds of electrode fingers, and a long period of time is required to design and manufacture the electrode fingers having widths varied from one another.

To eliminate the above problem, several methods for the weighting of finger width have been suggested. One of such methods is a withdrawal method disclosed in U.S. Pat. No. 4,281,301.

FIG. 1 illustrates a conventional reflector.

A reflector 1 has electrode fingers 2 having uniform widths w0 disposed at uniform intervals d0, as shown in FIG. 1. Weighting is carried out by withdrawing the electrode fingers 2 in accordance with predetermined rules. Element 2' denotes spaces where electrode fingers 2 have been withdrawn.

With this conventional reflector, however, as mentioned above, there has been a problem that a long period of time is required to design and manufacture the electrode fingers whose widths are gradually varied so as to continuously change the reflectivity of the reflector.

Another problem with the withdrawal method is that the reflector is weighted by only two levels of reflectivity. This causes the frequency response to differ from the desired characteristics, because accurate weighting cannot be performed.

SUMMARY OF THE INVENTION

A general object of the present invention is to provide surface acoustic wave devices in which the above disadvantages are eliminated.

A more specific object of the present invention is to provide surface acoustic wave reflectors whose electrode fingers are easy to design and check without degrading the frequency characteristics.

The above objects are achieved by a surface acoustic wave device having a piezoelectric substrate and a plurality of reflection portions formed on the piezoelectric substrate. The reflection portions are divided into groups, and the widths of the reflection portions are varied by the group.

Since the widths of the electrode fingers are varied by the group, it is not necessary to individually set the width of each electrode finger. Even if the number of electrode fingers is large, designing and checking the electrode fingers can be simplified, and the time required for manufacturing the electrode fingers can be shortened.

The above and other objects and features of the present invention will become more apparent from the following description taken in conjunction with the accompanying drawings.

DESCRIPTION OF THE PREFERRED EMBODIMENTS

The following is a description of embodiments of the present invention, with reference to the accompanying drawings.

Figure 1:
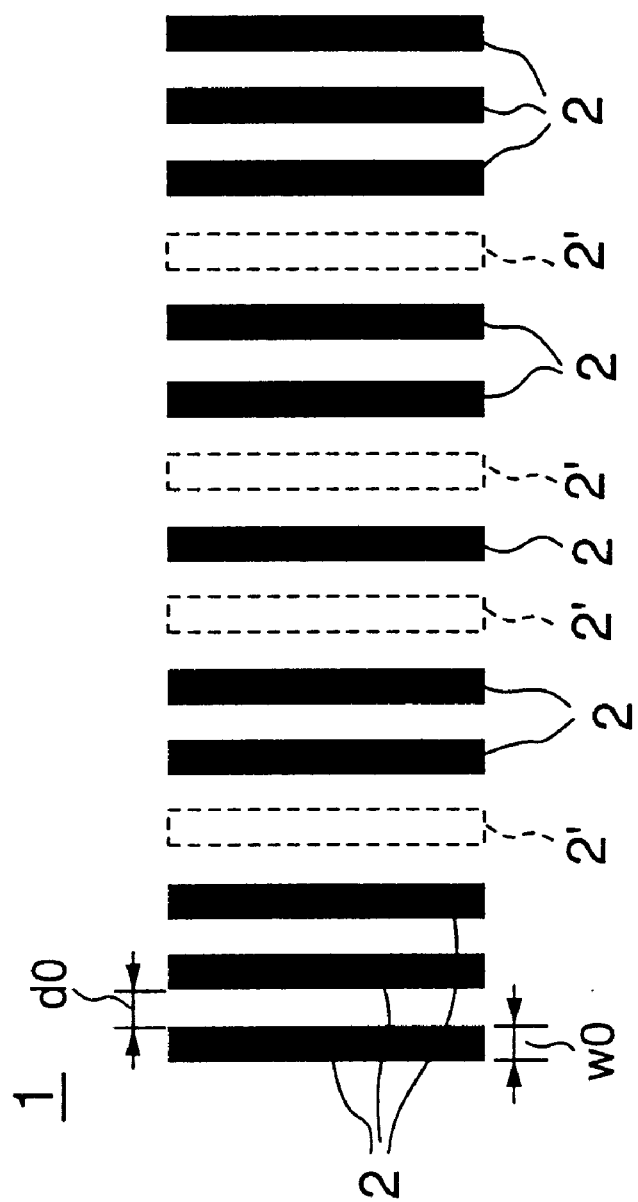
FIG. 1 shows the arrangement of the electrodes of a conventional reflector.
Figure 2:
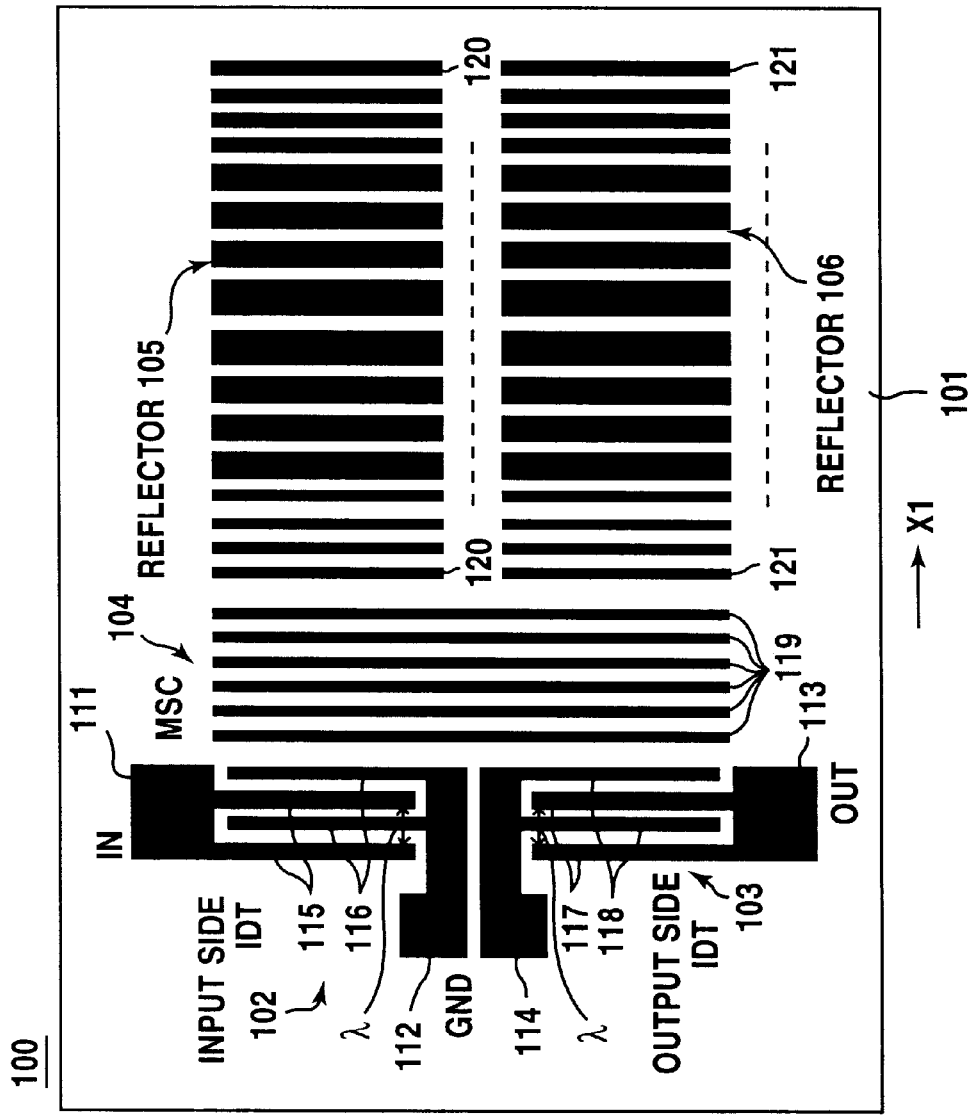
FIG. 2 illustrates one embodiment of the present invention.

FIG. 2 shows one embodiment of the present invention.

A surface acoustic wave device 100 forms a filter, and comprises a piezoelectric substrate 101, an input interdigital transducer 102, an output interdigital transducer 103, a coupler 104, and reflectors 105 and 106.

The piezoelectric substrate 101 is formed by a 128°YX LiNbO$_3$ substrate. The piezoelectric substrate 101 generates a surface acoustic wave by piezoelectric effects, and outputs a signal by the surface acoustic wave.

The input interdigital transducer (IDT) 102 is made up of an input electrode 111 and a grounding electrode (GND) 112. The input electrode 111 is disposed in parallel with an arrow Y. The input electrode 111 includes a plurality of electrode fingers 115 short-circuited with each other. The grounding electrode 112 is disposed in parallel with the arrow Y, and includes a plurality of grounded electrode fingers 116.

The electrode fingers 115 of the input electrode 111 are aligned and meshed with the electrode fingers 116 of the grounding electrode 112. Here, the electrode fingers 115 and the electrode fingers 116 are not in contact with each other. The electrode period ⌊ of the electrode fingers 115 and 116 is 20 µm.

The output interdigital transducer (IDT) 103 is made up of an output electrode 113 and a grounding electrode (GND) 114. The output electrode 113 is disposed in parallel with the arrow Y, and includes a plurality of electrode fingers 117 short-circuited with each other. The grounding electrode 114 is disposed in parallel with the arrow Y, and includes a plurality of grounded electrode fingers 118.

The electrode fingers 117 of the output electrode 113 are aligned and meshed with the electrode fingers 118 of the grounding electrode 114. Here, the electrode fingers 117 and the electrode fingers 118 are not in contact with each other. The electrode period ⌊ of the electrode fingers 117 and the electrode fingers 118 is 20 µm.

The coupler 104 is a multi-strip coupler (MSC), and is disposed on an X1 side of the input interdigital transducer 102 and the output interdigital transducer 103. The coupler 104 includes a plurality of electrode fingers 119 disposed in parallel with the arrow Y. The electrode fingers 119 are not in contact with each other.

The coupler 104 couples the input and output interdigital transducers 102 and 103 to the reflectors 105 and 106.

The reflector 105 is disposed on the X1 side of the coupler 104. The reflector 105 reflects surface acoustic waves of predetermined frequencies, and includes a plurality of electrode fingers 120 whose widths are varied in sets consisting of a plurality of electrode fingers. The electrode fingers 120 are not in contact with each other.

The reflector 106 is disposed on the X1 side of the coupler 104. The reflector 106 reflects surface acoustic waves of predetermined frequencies, and includes a plurality of electrode fingers 121 which are not in contact with each other.

The following is a more detailed description of the reflectors 105 and 106. Since the reflectors 105 and 106 have the same structure, only the reflector 105 will be described below.

Figure 3:
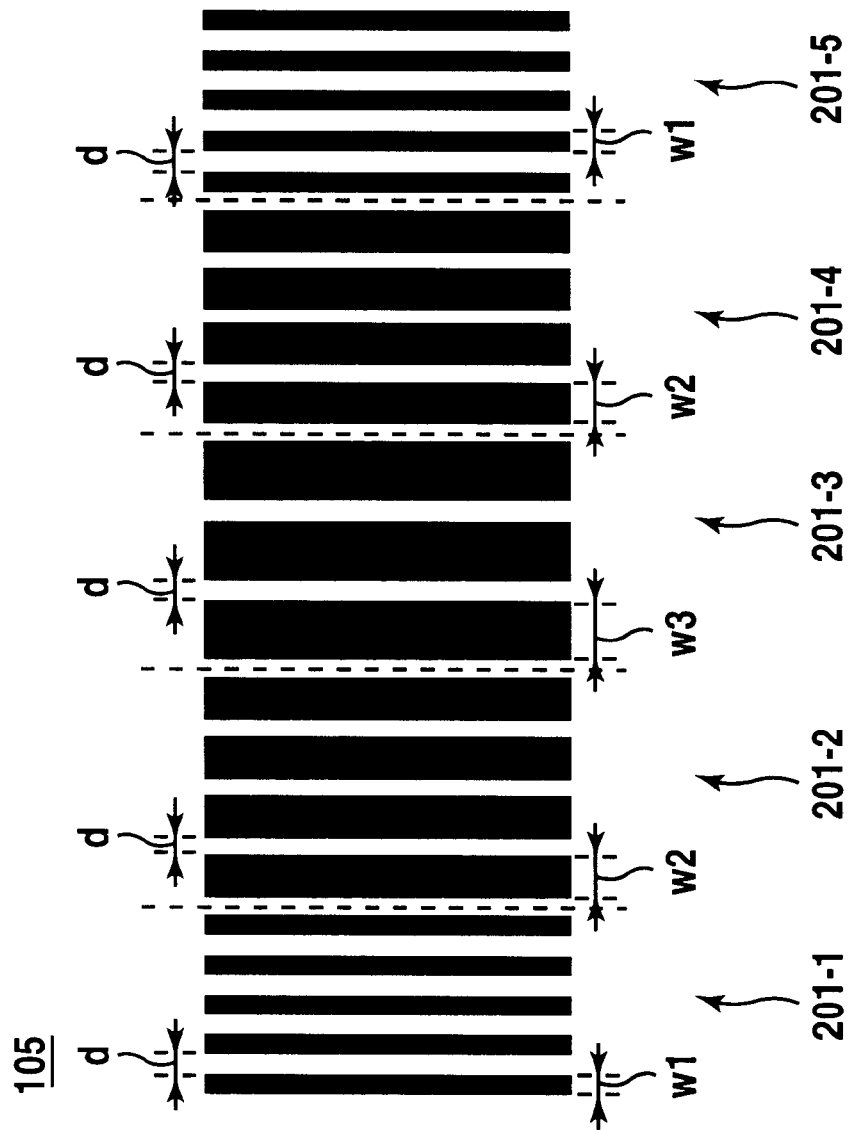
FIG. 3 illustrates the reflector of the present invention.

FIG. 3 shows the reflector 105 of the embodiment of the present invention.

The electrode fingers 120 of the reflector 105 are made of aluminum, for instance. As shown in FIG. 3, the electrode fingers 120 are divided into five electrode finger groups 201-1 to 201-5. Intervals d between the electrode fingers 120 are uniform, and each of the widths of the electrode fingers 120 is set at w1, w2, or w3. Each electrode finger of the electrode finger groups 201-1 and 201-5 has the width w1, each electrode finger of the electrode finger groups 201-2 and 201-4 has the width w2, and each electrode finger of the electrode finger group 201-3 has the width w3.

The widths of the electrode finger groups 201-1 to 201-5 are set so that the change of reflectivity with the number of electrode fingers approximates the Hamming function.

As described so far, the electrode fingers 120 are divided into the five electrode finger groups 201-1 to 201-5. In this manner, it is not necessary to individually set each width w and each interval d between the electrode fingers 120. Therefore, the designing and checking are carried out only for each electrode finger group, instead of each electrode finger. Thus, the designing and checking can be simplified.

In the conventional reflector, the widths of the electrode fingers are gradually varied from one another so that the change of the reflectivity depending on the number of electrode approximates the Hamming function. In this manner, excellent frequency response can be obtained. In the reflector of this embodiment, the electrode fingers are divided into groups, and an electrode finger width is set for each of the groups so that the stepwise change of the reflectivity depending on the number of electrode fingers approximates the Hamming function. With this structure, the frequency response close to those of the conventional reflector can be obtained.

In this embodiment, the intervals d between the electrode fingers of the electrode finger groups 201-1 to 201-5 are uniform, while the widths w are varied from w1 to w3. However, it is also possible to have uniform pitches p of the electrode fingers 120 and the varied widths.

Figure 4:
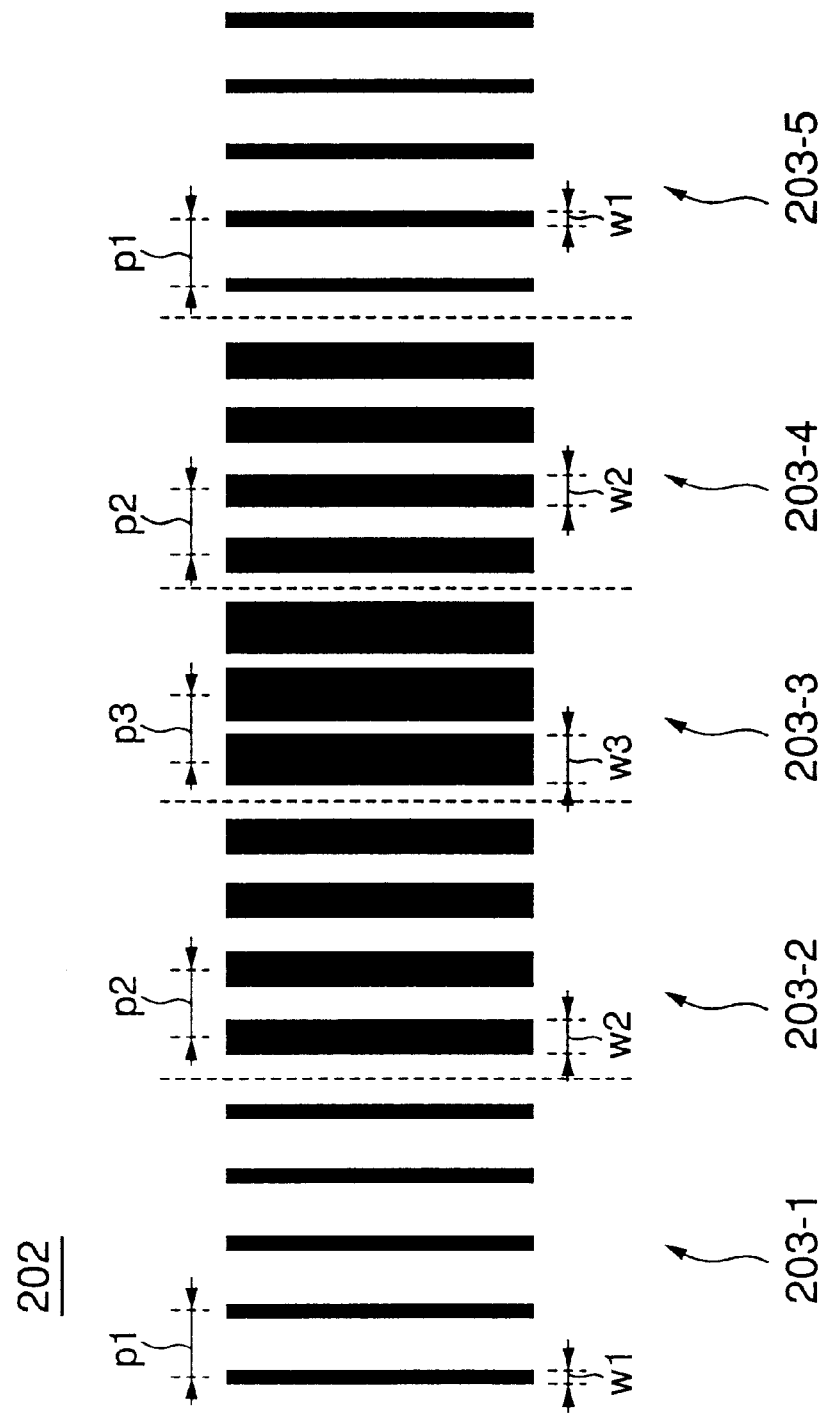
FIG. 4 illustrates a first modification of the reflector of the present invention.

FIG. 4 illustrates a first modification of the reflector of the embodiment of the present invention. In FIG. 4, the same components as in FIG. 3 are indicated by the same reference numerals.

A reflector 202 of this modification has the electrode fingers 120 divided into five electrode finger groups 203-1 to 203-5, as shown in FIG. 4. Pitches p1 to p3 of the electrode finger groups 203-1 to 203-5 are set so that the velocity difference of the surface acoustic waves between the groups can be compensated. Each electrode finger 120 of the electrode finger groups 203-1 and 203-5 has the width w1, each electrode finger 120 of the electrode finger groups 203-2 and 203-4 has the width w2, and each electrode finger 120 of the electrode finger group 203-3 has the width w3.

As described above, the electrode fingers 120 are divided into the five electrode finger groups 203-1 to 203-5. In this manner, it is not necessary to individually set each width w and each pitch p of the electrode fingers 120, and therefore, the designing and checking can be carried out for each electrode finger group, instead of each electrode finger. Thus, the designing and checking are simplified.

Although the electrode fingers 120 are open-circuited in the embodiments shown in FIGS. 3 and 4, the electrode fingers 120 may be short-circuited.

Figure 5:
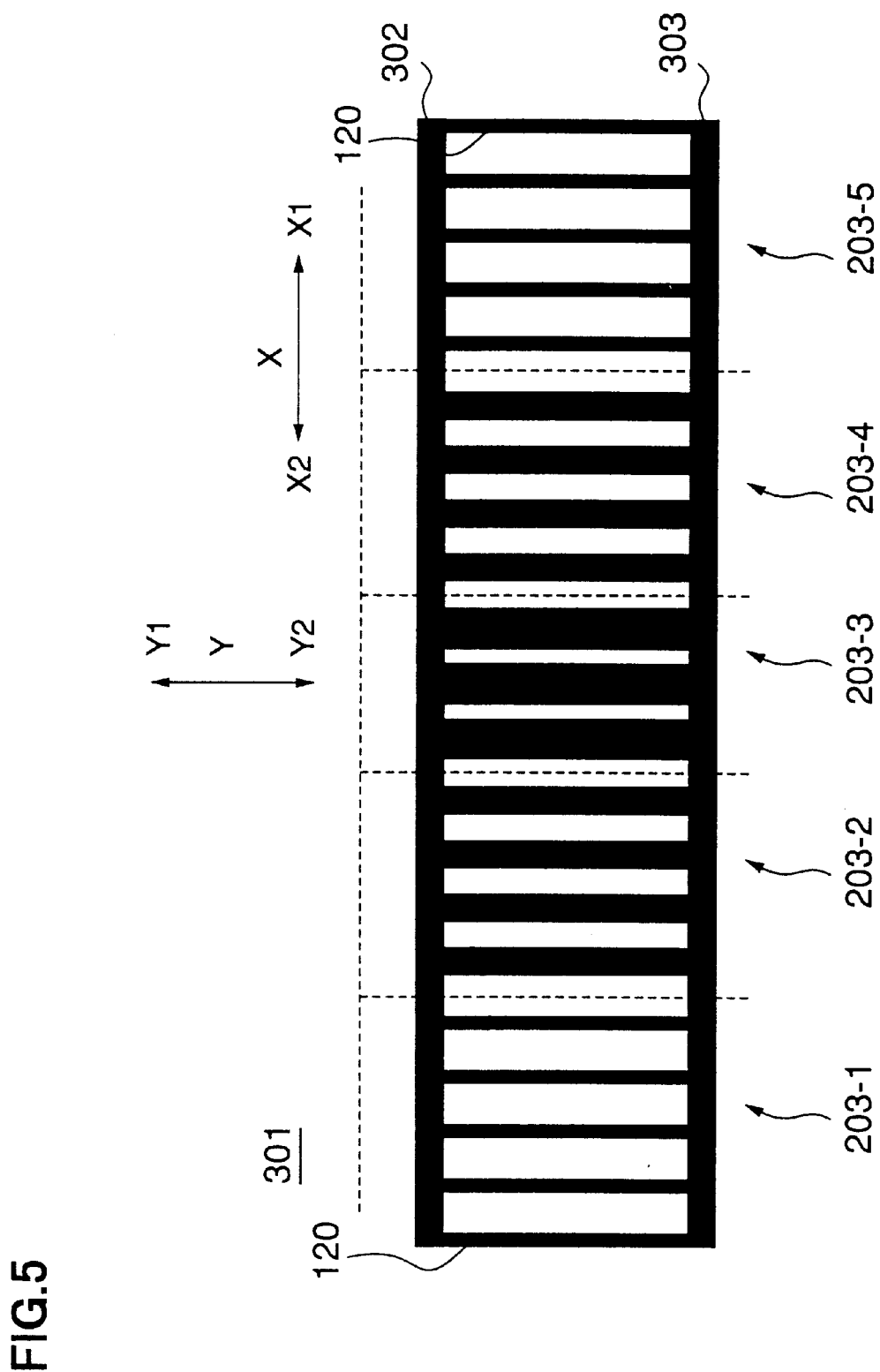
FIG. 5 illustrates a second modification of the reflector of the present invention.

FIG. 5 shows a second modification of the reflector of the embodiment of the present invention. In FIG. 5, the same components as in FIG. 4 are indicated by the same reference numerals.

A reflector 301 of this modification includes the electrode fingers 120 disposed as in FIG. 4, and connecting electrodes 302 and 303 which connect the ends of the electrode fingers 120. The connecting electrodes 302 and 303 extend in the direction of the arrow X.

In this modification, the electrode fingers 120 are divided into the five electrode finger groups 203-1 to 203-5, as described above. In this manner, it is not necessary to individually set each width w and each pitch p of the electrode fingers 120, and the designing and checking can be carried out for each electrode finger group, instead of each electrode finger.

The frequency response of the reflector 301 of this embodiment are substantially the same as the frequency characteristics of a reflector in a case where the widths of the electrode fingers are varied from one another.

Although the reflectors 105, 203, and 301 have the electrode fingers 120 as shown in FIGS. 3 to 5, the electrode fingers 120 may be replaced by protrusions formed on the piezoelectric substrate 101. In this manner, the same effects as those of the reflectors 105, 203, and 301 can be obtained.

Figure 6:
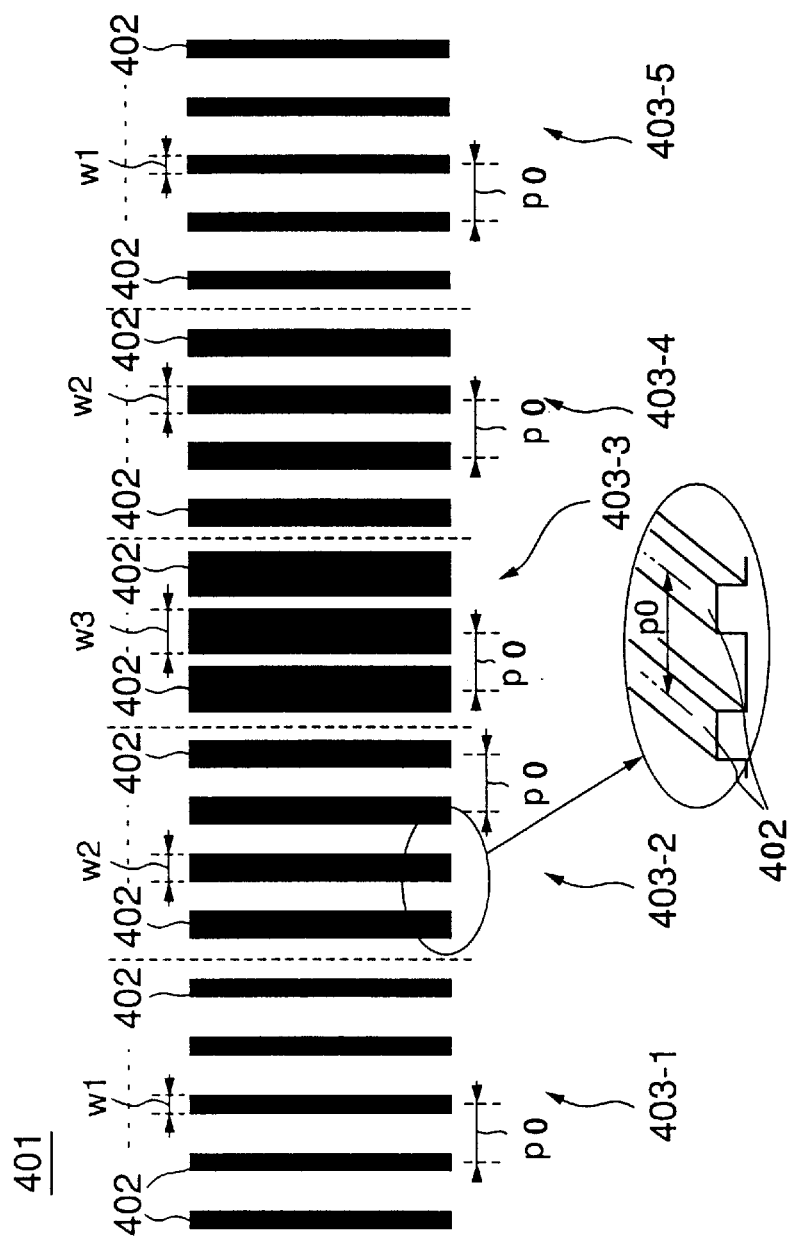
FIGS. 6A and 6B illustrate a third modification of the reflector of the present invention.

FIGS. 6A and 6B show a third modification of the reflector of the embodiment of the present invention. FIG. 6A is a plan view of a reflector, and FIG. 6B is a perspective view of a part of the reflector.

The reflector 401 of this modification has protrusions 402 which are divided into five protrusion groups 403-1 to 403-5, as shown in FIG. 6A. The protrusions 402 in the protrusion groups 403-1 to 403-5 have uniform pitches p0, and the widths of the protrusions 402 are set at w1, w2, or w3. Each protrusion 402 in the protrusion groups 403-1 and 403-5 has the width w1, each protrusion 402 in the protrusion groups 403-2 and 403-4 has the width w2, and each protrusion 402 in the protrusion group 403-3 has the width w3.

The widths w1 to w3 of the protrusion groups 403-1 to 403-5 are set so that the change of reflectivity of the surface acoustic wave with the number of protrusions approximates the Hamming function.

In this modification, the protrusions 402 are divided into the five protrusion groups 403-1 to 403-5, as described above. In this manner, it is not necessary to individually set each width w and each pitch p of the protrusions 402, and the designing and checking can be carried out for each protrusion group, instead of each protrusion.

In this embodiment, the electrode fingers in the center are wider than the electrode fingers on both sides. Alternatively, the electrode fingers on both sides may be wider than the electrode fingers in the center.

Also, the widths of the electrode fingers, the total number of electrode fingers, and the number of electrode fingers included in each electrode finger group are not limited to the above embodiment.

Next, the frequency responses of the reflectors of the above embodiments will be described, with reference to experimental results.

The piezoelectric substrate is a 128°YX LiNbO$_3$ substrate; the grating pitch p of the reflector is 10 $\mu$m; the number of electrode fingers is 200; the electrode layers are made of aluminum, and the layer thickness is 0.2 $\mu$m. The widths w of the electrode fingers of the reflector are set so that the change of reflectivity approximates the Hamming function.

Figure 7:
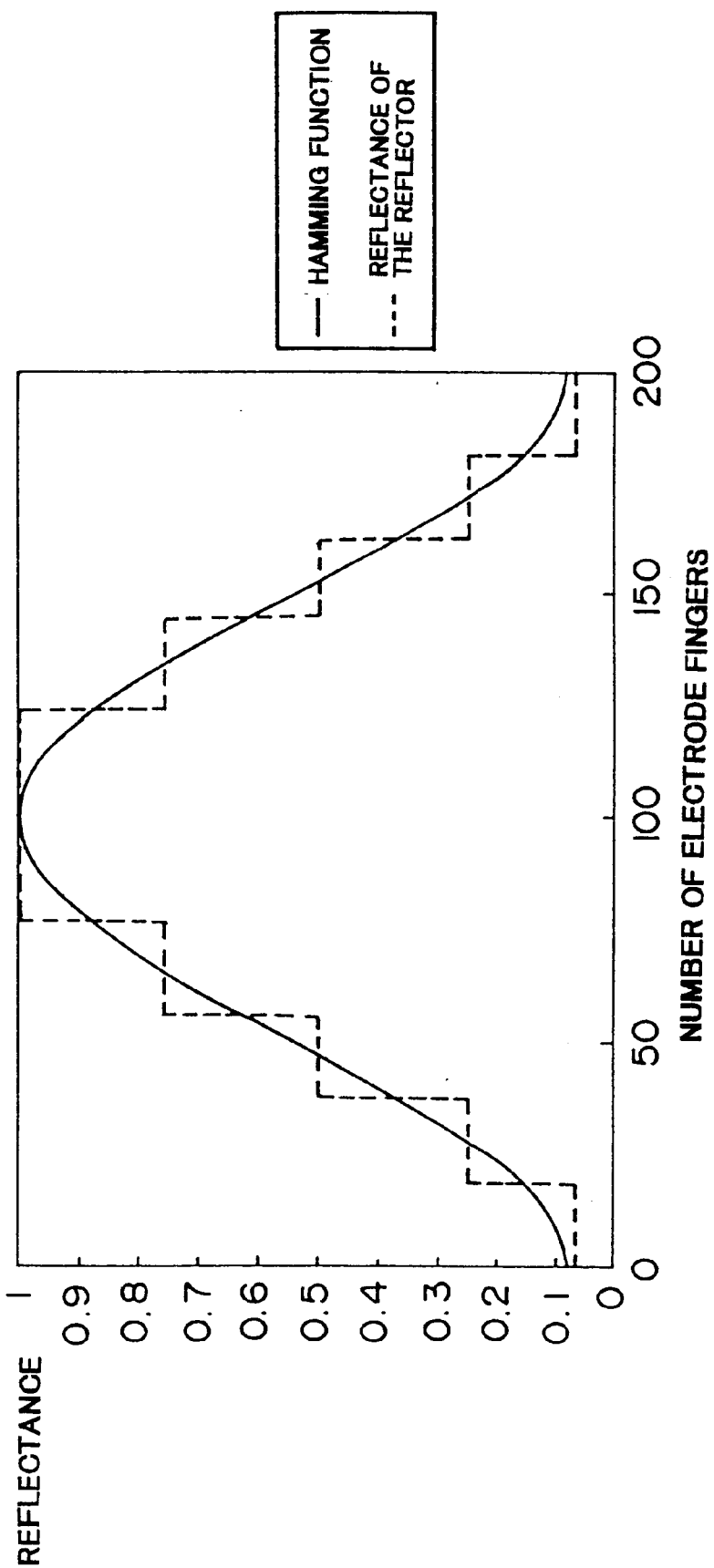
FIG. 7 is a graph showing changes in reflectivity and Hamming function with the number of electrode fingers.

FIG. 7 is a graph showing the change of reflectivity and Hamming function with the number of electrode fingers. In FIG. 7, the solid line indicates the Hamming function, and the broken line indicates the change of reflectivity.

The ratio of the widths w of the electrode fingers to the grating pitch is set in the range of 0.1 to 0.5 wherein increments within this range are increased by multiples of 0.1, so that the change of reflectivity with the number of electrode fingers approximates the Hamming function indicated by the solid line in FIG. 7. In other words, the intervals at which the ratio w/p is increased are 0.1, 0.2, 0.3, 0.4 and 0.5.

Figure 8:
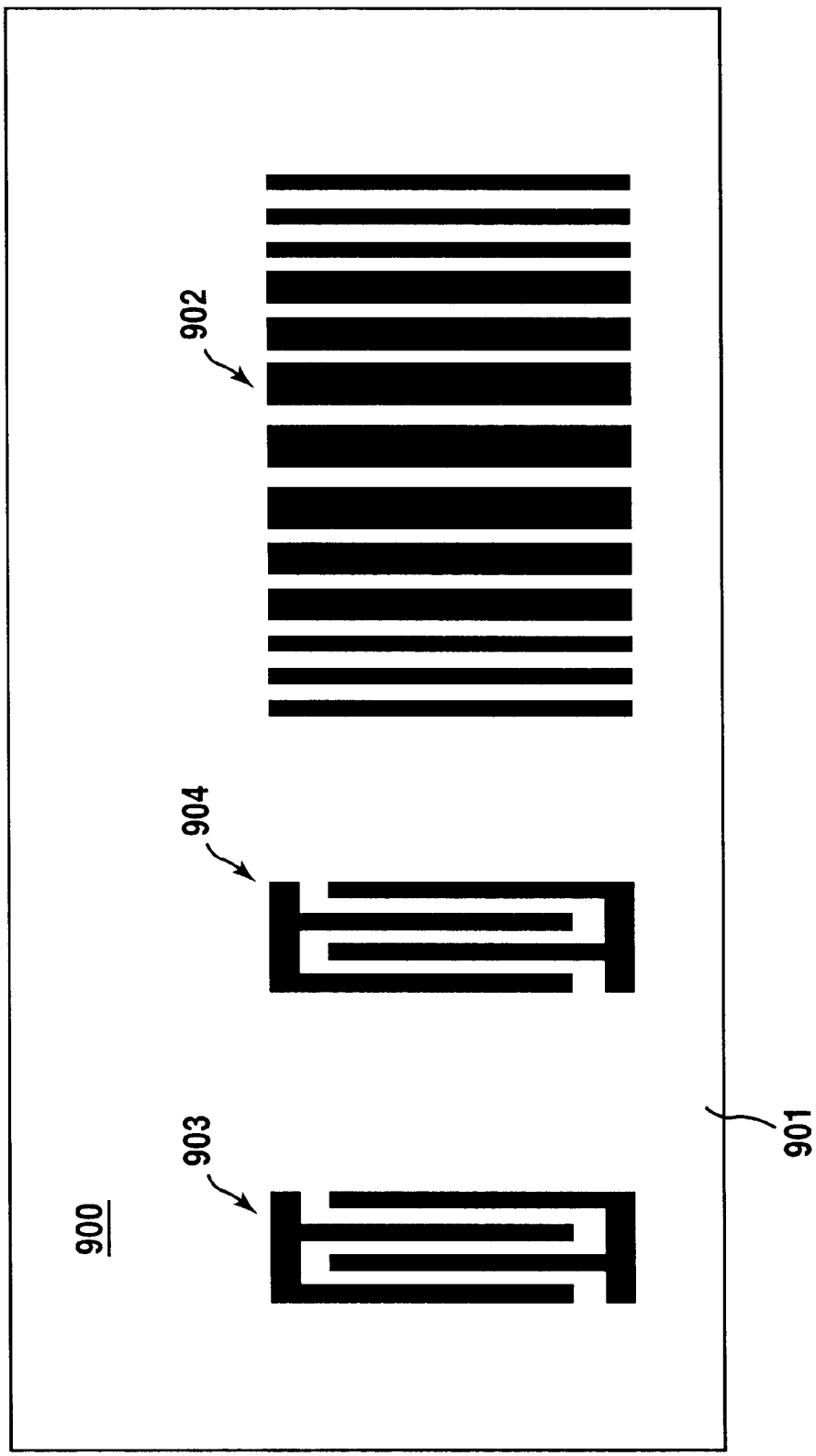
FIG. 8 illustrates a surface acoustic wave device produced for evaluating the frequency response of the reflector of the present invention.

FIG. 8 illustrates a surface acoustic wave device produced for evaluating the frequency response of the reflector of the embodiment of the present invention.

A surface acoustic wave device 900 shown in FIG. 8 comprises: a piezoelectric substrate 901 made of a 128°YX LiNbO$_3$ substrate; a reflector 902 formed by an aluminum electrode layer; an input interdigital transducer 903; and an output interdigital transducer 904.

Figure 9:
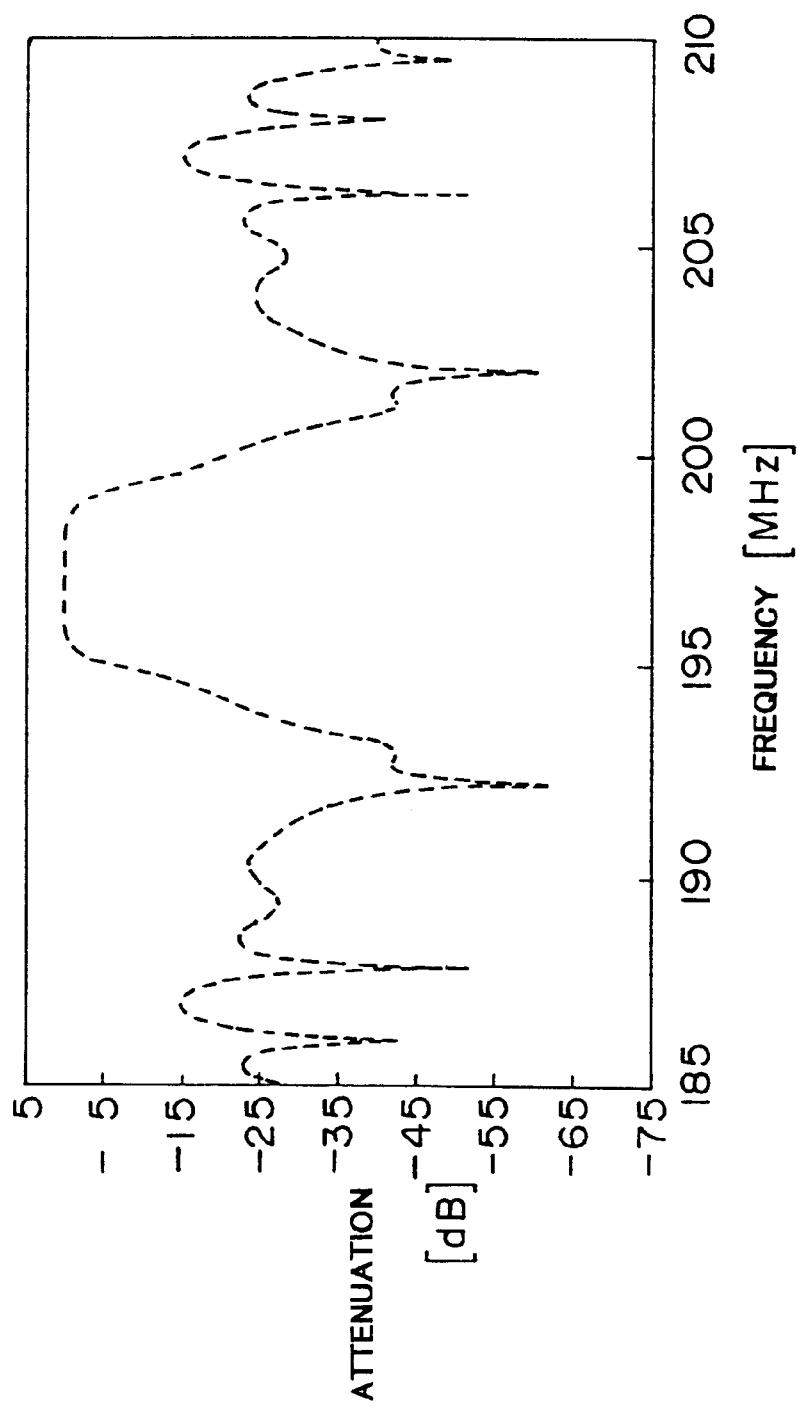
FIG. 9 shows the frequency response of the weighted reflector of the present invention.
Figure 10:
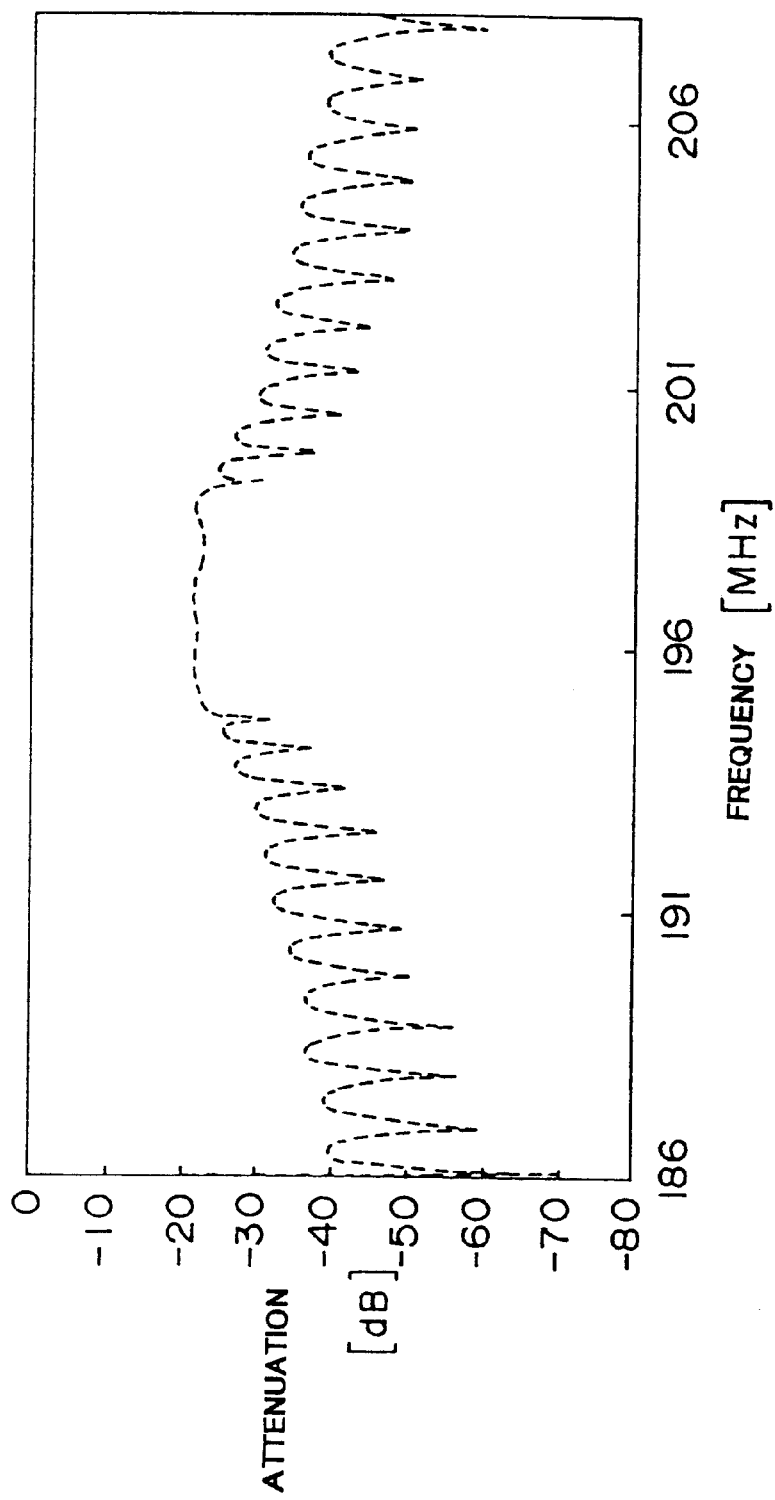
FIG. 10 shows the frequency response in a case where no weighting is carried out.

FIG. 9 shows the frequency response of the reflector of the embodiment (shown in FIGS. 2 and 3) when weighting is carried out, and FIG. 10 shows the frequency response in a case where no weighting is carried out.

When the electrode fingers are weighted at five levels as shown in FIG. 9, the out-of-band rejection level is greater compared with a case where the electrode fingers are not weighted, as shown in FIG. 10. Accordingly, when weighting is carried out, only the signals in the main lobe are emphasized.

Figure 11:
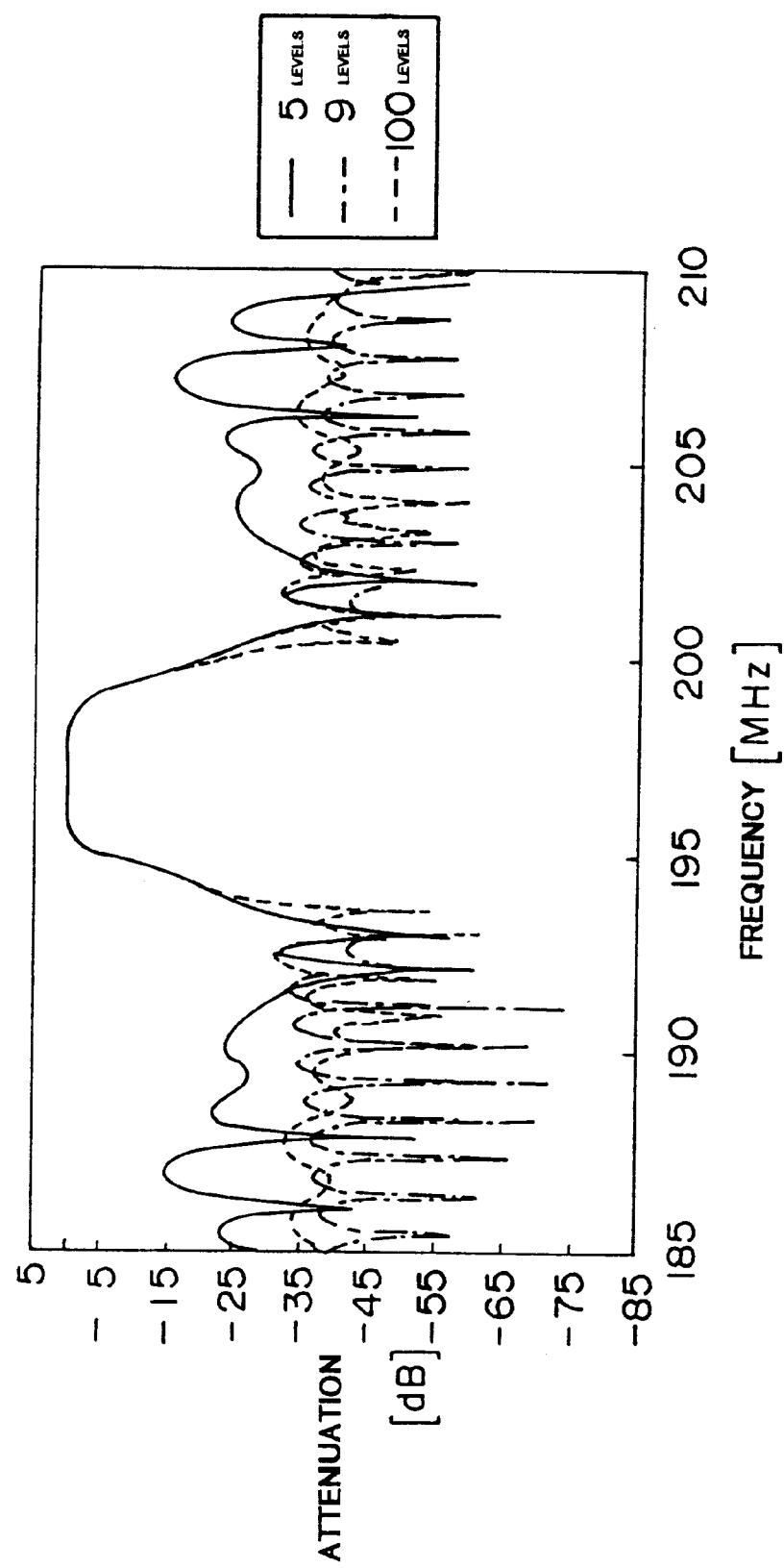
FIG. 11 shows the frequency response of the reflectors of the present invention when the number of weighting levels is increased.
Figure 12:
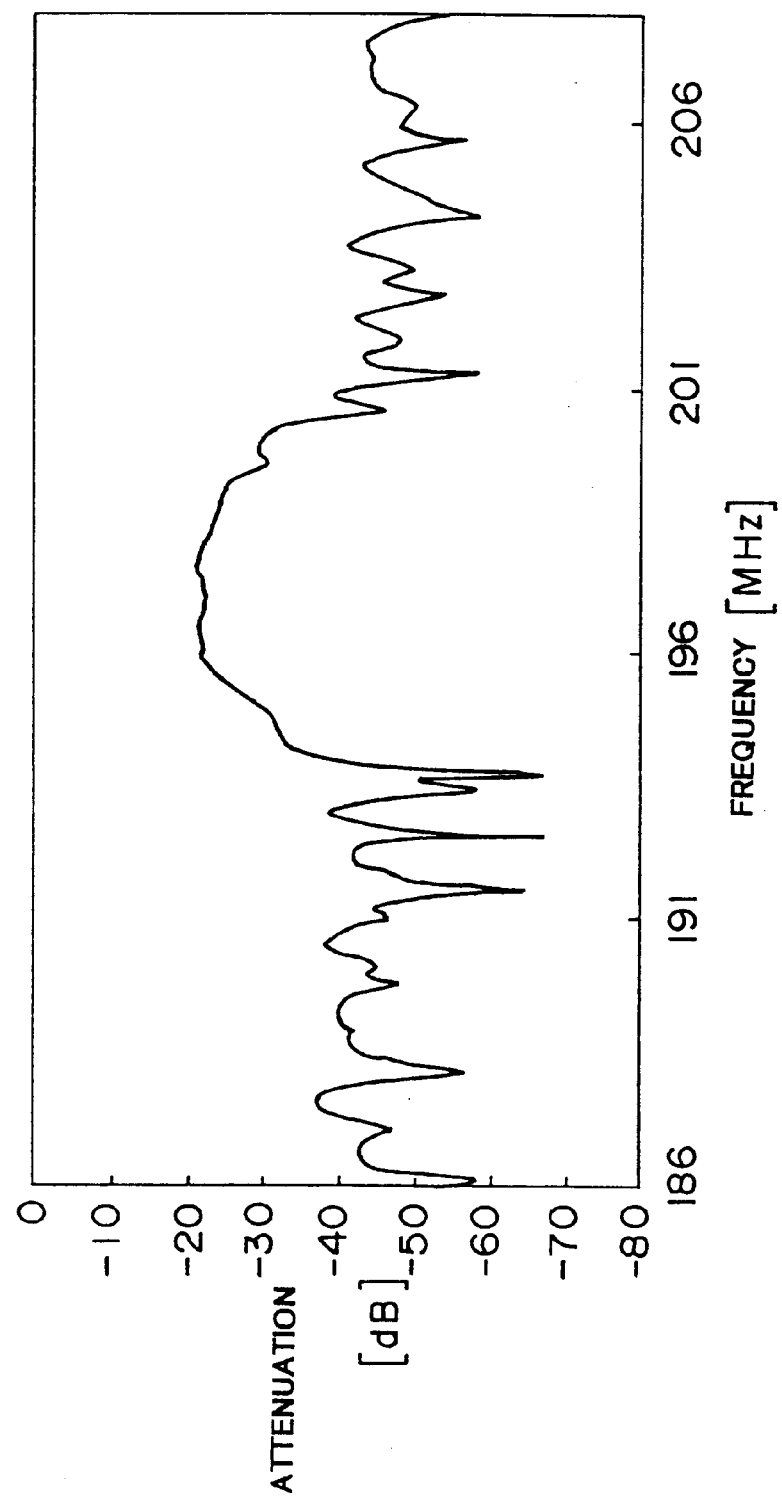
FIG. 12 shows the frequency response of the reflector of the present invention when the number of weighting levels is 5.
Figure 13:
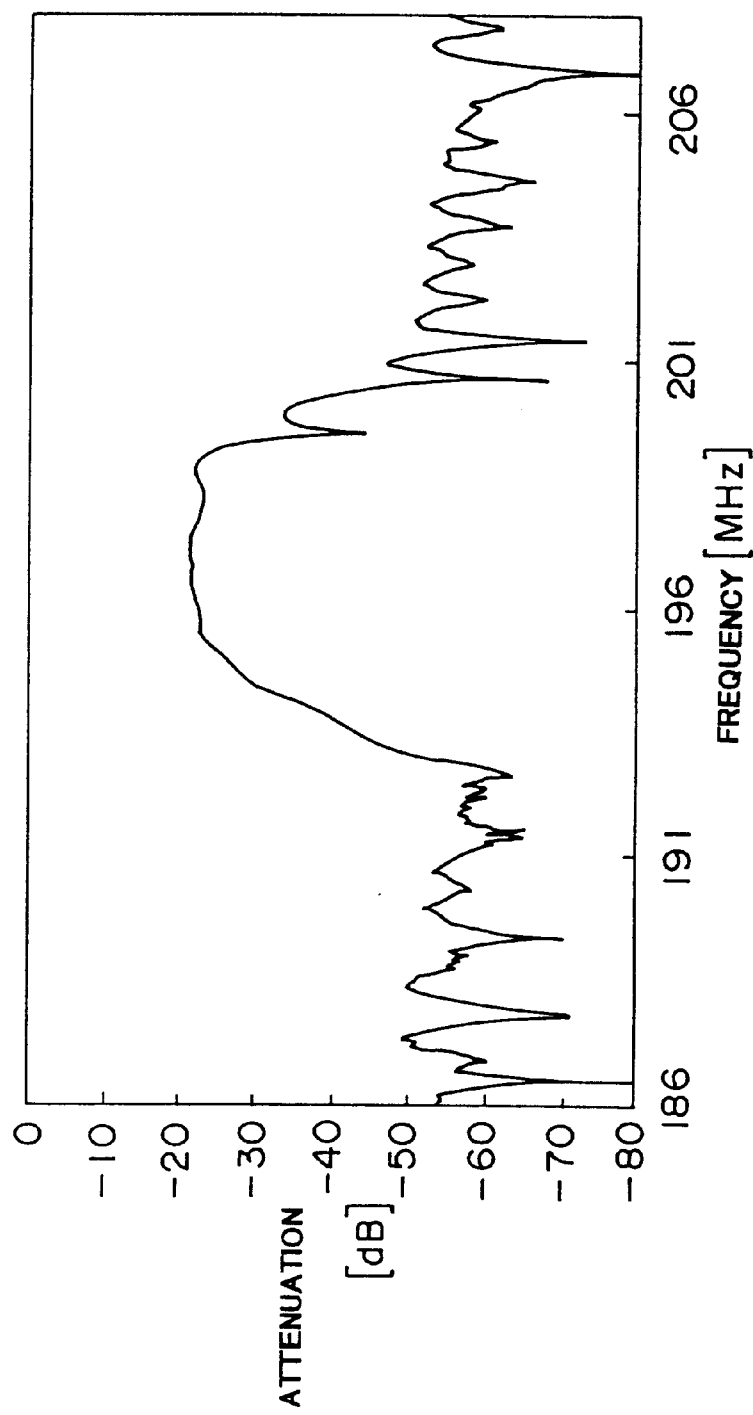
FIG. 13 shows the frequency response of the reflector of the present invention when the number of weighting levels is 9.

FIG. 11 shows the frequency responses of the reflector of the above embodiment when the number of weighting levels is increased. FIG. 12 shows the frequency response of the reflector of the embodiment when the number of weighting levels is 5. FIG. 13 shows the frequency response of the reflector of the embodiment when the number of weighting levels is 9.

The solid lines in FIG. 11 and FIG. 12 indicate the frequency responses of the reflector 902 when the number of weighting levels is 5. The dot-and-dash line in FIG. 11 and the solid line in FIG. 13 indicate the frequency responses of the reflector 902 when the number of weighting levels is 9. The broken line in FIG. 11 indicates the frequency characteristics of the reflector 902 when the number of the weighting levels is 100.

As shown in FIG. 11, in the band area, there is little difference in the frequency response of the reflector 902 whether the number of weighting levels is large or not. Also, the frequency responses outside the band area are not greatly varied whether the number of weighting levels is 9 or 100, as shown in FIG. 11.

Furthermore, if the number of weighting levels is small, it is not necessary to set many widths, thereby simplifying the designing process. Even if the number of weighting levels for the reflector 902 is less than 10, excellent characteristics can be obtained.

The following is a description of the difference in the frequency responses between the modifications of the reflector shown in FIGS. 4 to 6B and the reflector shown in FIG. 3.

Figure 14:
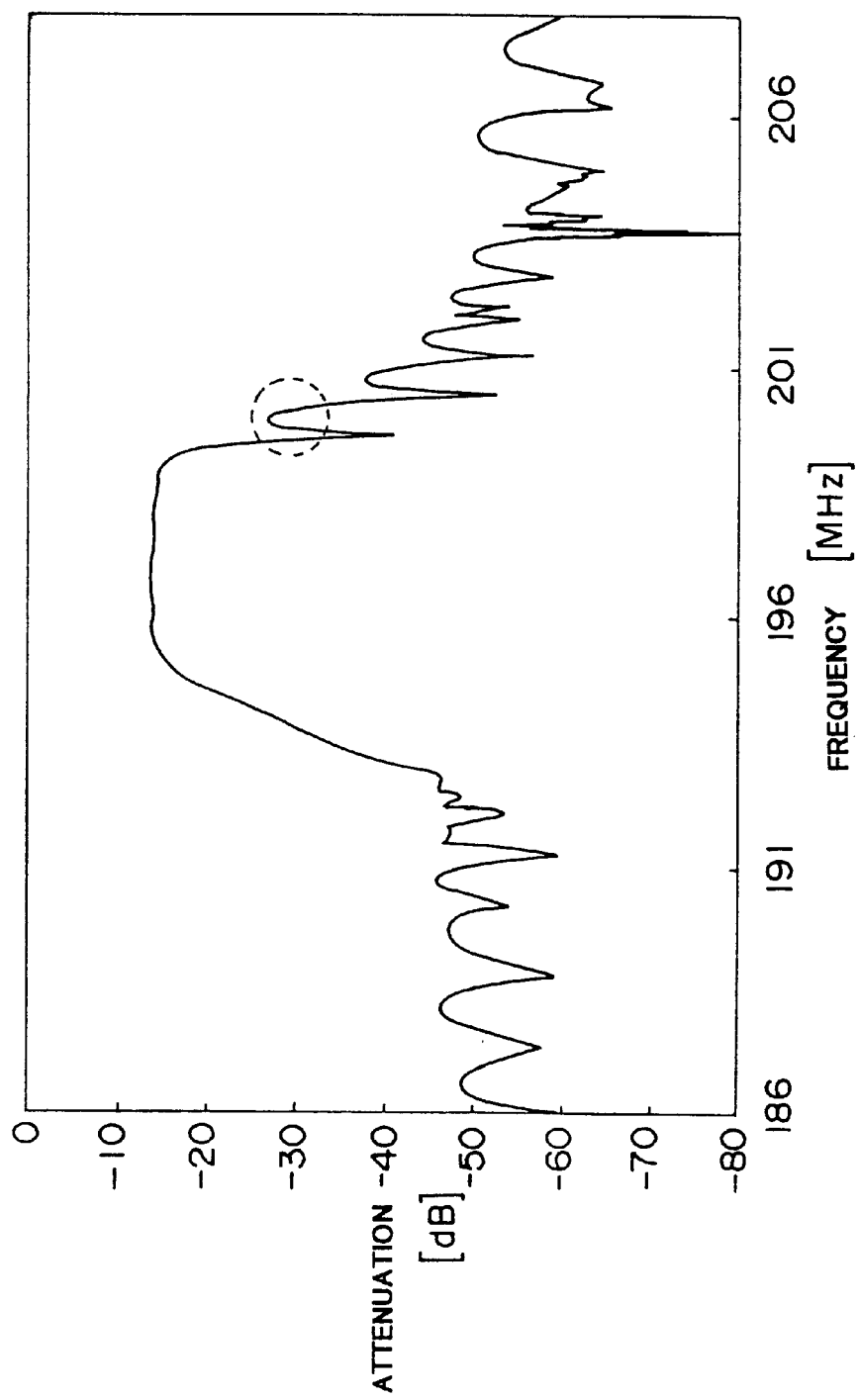
FIG. 14 shows the frequency response of the reflector of the present invention having a peak to be restrained.
Figure 15:
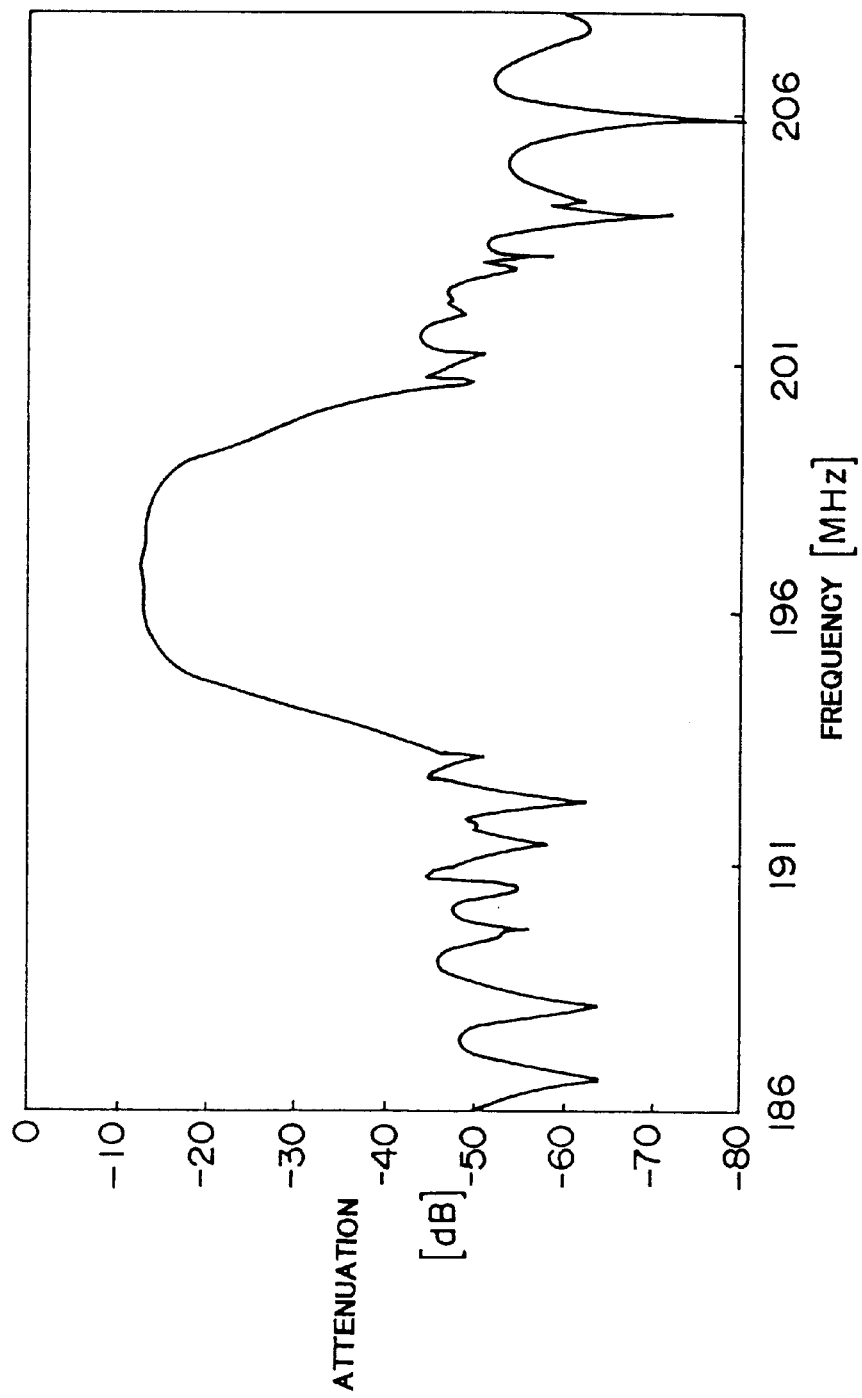
FIG. 15 shows the frequency characteristics of a modification of the reflector of the present invention.

FIG. 14 shows the frequency response of the reflector of the embodiment (shown in FIGS. 4, 5, and 6), and FIG. 15 shows the frequency response of a modification of the reflector of the embodiment.

If the intervals between the electrode fingers of the reflector 902 are varied and or gradually narrowed, as shown in FIGS. 4 to 6B, the part indicated by the broken line or circle in FIG. 14 can be restrained as shown in FIG. 15.

Since the widths of the electrode fingers of the embodiment of the present invention are varied at several levels, it is not necessary to individually set a width for each electrode finger. Thus, even if the number of the electrode fingers is large, the time required for designing the electrode fingers can be dramatically shortened.

Although the present invention has been fully described by way of examples with reference to the accompanying drawings, it is to be noted that various changes and modifications will be apparent to those skilled in the art. Therefore, unless otherwise such changes and modifications depart from the scope of the present invention, they should be construed as being included therein.

What is claimed is:

1. A surface acoustic wave device comprising:

a piezoelectric substrate which transmits a surface acoustic wave; and a plurality of reflection portions formed on the piezoelectric substrate, wherein the plurality of reflection portions are divided into groups, each of the groups includes electrode fingers, the groups have particular widths of the electrode fingers, an electrode finger width is set for each of the groups so that a stepwise change of reflectivity depending on the number of electrode fingers approximates the Hamming function, and the electrode fingers in an identical group have an identical width and are spaced apart from each other at an identical interval.

2. The surface acoustic wave device according to claim 1, wherein the number of the groups is 10 or smaller.

3. The surface acoustic wave device according to claim 1, wherein the plurality of electrode fingers have pitches which are stepwise varied by the group.

4. The surface acoustic wave device according to claim 1, wherein the plurality of electrode fingers are made of a conductive material.

5. The surface acoustic wave device according to claim 4, wherein the plurality of electrode fingers are short-circuited with each other.

6. The surface acoustic wave device according to claim 4, wherein the plurality of electrode fingers are open-circuited with each other.

7. The surface acoustic wave device according to claim 1, further comprising:

an input unit which generates a surface acoustic wave on the piezoelectric substrate in accordance with an input signal; and an output unit which outputs an output signal in accordance with the surface acoustic wave generated by the input unit and reflected by the plurality of reflection portions.

\* \* \* \* \*

UNITED STATES PATENT AND TRADEMARK OFFICE
CERTIFICATE OF CORRECTION

PATENT NO.    : 6,278,219 B1
DATED         : August 21, 2001
INVENTOR(S)   : Yasufumi Kaneda et al.

It is certified that error appears in the above-identified patent and that said Letters Patent is hereby corrected as shown below:

<u>Title page,</u>
Item [73], Assignee, please add the following assignee information:

-- [73] Assignee: Fujitsu Limited, Kawasaki (JP) and Fujitsu Media Devices Limited, Suzaka, (JP) --

Signed and Sealed this

First Day of October, 2002

*Attest:*

*Attesting Officer*

JAMES E. ROGAN
*Director of the United States Patent and Trademark Office*